US006180967B1

United States Patent
Zanatta et al.

(10) Patent No.: US 6,180,967 B1
(45) Date of Patent: Jan. 30, 2001

(54) BICOLOR INFRARED DETECTOR WITH SPATIAL/TEMPORAL COHERENCE

(75) Inventors: Jean-Paul Zanatta; Pierre Ferret, both of Grenoble; Philippe Duvaut, St-Egreve, all of (FR)

(73) Assignee: Commissariat a l'Energie Atomique, Paris (FR)

( * ) Notice: Under 35 U.S.C. 154(b), the term of this patent shall be extended for 0 days.

(21) Appl. No.: 09/147,454

(22) PCT Filed: Apr. 29, 1997

(86) PCT No.: PCT/FR97/00760

§ 371 Date: Dec. 29, 1998

§ 102(e) Date: Dec. 29, 1998

(87) PCT Pub. No.: WO98/49734

PCT Pub. Date: Nov. 5, 1998

(51) Int. Cl.[7] .................. H01L 31/072; H01L 31/109; H01L 31/0328; H01L 31/0336
(52) U.S. Cl. .................. 257/184; 257/185; 257/440; 257/441; 257/442; 438/93; 438/94; 438/95
(58) Field of Search .................. 257/184, 185, 257/440, 441, 442; 438/93, 94, 95

(56) References Cited

U.S. PATENT DOCUMENTS

| 4,910,154 | 3/1990 | Zanio et al. ............... 437/5 |
| 4,956,304 | * 9/1990 | Cockrum et al. ........... 437/5 |
| 4,956,686 | 9/1990 | Borrello et al. ........... 357/30 |
| 4,965,649 | * 10/1990 | Zanio et al. .............. 357/30 |
| 5,004,698 | * 4/1991 | Norton et al. ............. 437/3 |
| 5,113,076 | 5/1992 | Schulte ............. 250/370.06 |
| 5,360,987 | 11/1994 | Shibib ................... 257/446 |
| 5,466,953 | * 11/1995 | Rosbeck et al. ............ 257/185 |
| 6,030,853 | * 2/2000 | Tregilgas et al. .......... 438/95 |
| 6,049,116 | * 4/2000 | Park et al. ............... 257/442 |
| 6,049,118 | * 4/2000 | Nagano .................... 257/462 |

FOREIGN PATENT DOCUMENTS

| 0 475 525 | 3/1992 | (EP) . |
| 2 646 558 | 11/1990 | (FR) . |
| 2 284 930 | 6/1995 | (GB) . |

OTHER PUBLICATIONS

M. B. Reine, et al., U. S. Naval Research Laboratory Contract N000 14–91–C–2357, p. 145, "Independently–Accessed Back–to–Back HgCdTe Photodiodes: A New Dual–Band Infrared Detector", 1993.

J. P. Faurie, et al., Journal of Crystal Growth, vol. 54, pp. 582–585, "Molecular Beam Epitaxy of II–VI Compounds:$Cd_xHg_{1-x}Te$", 1981.

A. Million, et al., Journal of Crystal Growth, vol. 127, pp. 291–295, "HgCdTe Double Heterostructure for Infrared Injection Laser", 1993.

D. Amingual, et al., Semiconductor and Semimetals, SPIE, vol. 1735, p. 27, "Recent Improvements of IRFPAs at LIR", 1981.

Daniel Amingual, SPIE, vol. 1512, 1 p. 40, "Advanced Infrared Focal Plane Array", 1991.

\* cited by examiner

*Primary Examiner*—William Mintel
(74) *Attorney, Agent, or Firm*—Oblon, Spivak, McClelland, Maier & Neustadt, P.C.

(57) ABSTRACT

A dual-band planar infrared detector with space-time coherence, with a stack of semiconductor layers (16, 18, 20, 21) forming first and second photodiodes. The detector has a planar structure in which each layer has a part showing on a surface (22) substantially perpendicular to the stack.

13 Claims, 2 Drawing Sheets

BICOLOR INFRARED DETECTOR WITH SPATIAL/TEMPORAL COHERENCE

TECHNICAL FIELD

The present invention relates to a dual-band infrared detector with space-time coherence and to its method of manufacture.

In a dual-band detection device with space and time coherence, infrared photons coming from two different wavelength bands are detected at the same point in a focal plane of the detector and at the same time, dual-band infrared detectors finding many applications, notably in the production of infrared cameras and in the study of the atmosphere, observations of the Earth and other applications in the space field.

PRIOR ART

A wide variety of infrared detectors are known, whose specific design makes it possible to favor certain detection characteristics. Dual-band infrared detectors can thus be judged according to various criteria such as their performance, their production costs, their compactness, and also their manufacturing technology. Obviously, all these criteria depend more or less on each other and it is difficult to optimise them all simultaneously. A first example of a known dual-band infrared detector is given by Reine et al. "Independently Accessed Back-to-Back HgCdTe photodiodes: A New Dual-Band Infrared Detector", Rensselaer Polytechnic Institute, Troy, N.Y., 12180, 1993, U.S. Workshop on the physics and chemistry of Mercury Cadmium Teluride and other IR materials—Seattle (Wash.). This detector has a stacking of a number of layers of semiconductor material which forms two detection diodes biased in opposition with respect to each other and coupled by n-type doped layers or regions, i.e. doped with impurities of the donor type. Like the majority of infrared detectors, the layers of semiconductor material are thin layers of CdHgTe compound, that is to say of Cadmium-Mercury-Tellurium compound, or CMT, deposited epitaxially on a substrate. The detector is produced according to the technology known as "MESA". "MESA" technology means a production of a semiconductor device where the delimitation of the active layers is effected by an etching which leaves a number of "reliefs". This etching can be either mechanical, for example mechanical abrasion, or chemical in the case of the dual-band detector of Reine et al. The etching defines detection points or pixels which have a height of around a tenth of a micrometer.

Producing detectors according to "MESA" technology presents a number of difficulties. Producing integrated semiconductor devices and particularly producing infrared detectors requires a certain number of so-called photolithographic steps which consist in depositing masking patterns on the structure in order to protect certain parts thereof and define the components to be produced, or so-called resin coating steps which also serve to protect certain parts of the structure. The masking patterns cannot be correctly produced simultaneously at different heights or altitudes on the device, i.e. both at the top and bottom of a MESA detection pixel for example. Likewise, during the resin coating steps, it is difficult to obtain a homogeneous and constant thickness. Imprecisions in the production of the patterns by photomasking and resin layers during steps of manufacture of the detector do not allow good definition so small patterns.

Moreover, in the detector of Reine et al., various stacked layers, which form the detector open out on the side of the pixel. Passivation of the pixel is therefore all the more difficult since it must be produced on a sloping side, which can cause electrical leakages at the junction. Finally it may be noted that, in Reine et al., the common contact layer of the pixels is produced from a p-type material. Such a material exhibits mobility of the carriers (holes) lower than that of n-type materials (electrons) and consequently a higher resistivity.

U.S. Pat. No. 5,113,076 gives a second example of a dual-band infrared detector. The device described in this document has two oppositely poled diodes connected in series, and intended respectively for measuring infrared photons with long and short wavelengths. It is formed by a stacking of a layer of n-doped CdHgTe compound, a layer of p-doped CdHgTe and then an n-doped CdHgTe layer. However, the photocurrent of the diode with long wavelengths cannot be read at the same time as the diode with the shorter wavelengths. The device is therefore not time-coherent.

Yet another example is given by U.S. Pat. No. 4,956,686. The detector according to this document has buried structures which allow a so-called "planar" technology in distinction to "MESA" technology; planar technology consists of locally producing active layers on the surface of a substrate by effecting diffusions, implantations or epitaxial deposits through masks. Detection elements sensitive on the one hand to short wavelength and on the other hand to long wavelengths are however produced alongside each other in the focal plane. The detection is therefore in this case not spatially coherent. In addition, the detection elements described in this document are of the MIS (Metal Insulating Semiconductor) type, which proves to have a lower performance from the production point of view than elements of the photovoltaic type.

In the same way as U.S. Pat. No. 4,956,868, EP 0 475 525 can be cited, which concerns an infrared detector sensitive to several different wavelengths, but where the detection elements corresponding to these wavelengths are also disposed alongside each other.

One object of the present invention is to provide a dual-band infrared detector which is both space and time coherent and which does not exhibit the previously mentioned drawbacks.

Another object of the invention is to provide a method of producing the detector which is both simple to implement and avoids the drawbacks mentioned above.

DISCLOSURE OF THE INVENTION

To this end, the invention more precisely relates to a dual-band planar infrared detector with space-time coherence with at least one detection element having, a direction y, a stacking of semiconductor layers forming first and second photodiodes electrically connected in series and oppositely poled, characterized in that it has a planar structure where each layer has a part showing on a surface of the detection element, the surface being substantially perpendicular to the direction y.

According to one method of implementing the invention, the stack has a first layer made from a material of a first conduction type, at least one second layer made from a material of a second conduction type, a third layer made from a material of the second conduction type, separated from the first layer by the second layer, and the fourth layer made from a material of the first conduction type, separated from the second layer by the third layer, the first and third layers forming respectively, with the second and fourth layers, the first and second photodiodes.

According to one aspect of the invention, the materials used from the different layers of the detector are CMT materials.

CMT material means an alloy incorporating the elements Cadmium (Cd), Mercury (Hg) and Tellurium (Te). Advantageously, it is possible to adjust the energy or the Prohibited band of these materials by acting on the chemical composition of the alloy, and therefore to select the wavelengths to which the detection elements are sensitive.

As each detection layer has a part flush showing on a plane surface, it is easier to produce electrical connections for connecting the detector to an electronic measuring circuit for example.

According to a particular advantageous embodiment of the invention, the layers of material of the first condition type are n-doped, i.e. with impurities or defects of the donor type supplying negative-charge electrical carriers. The layers of the second conduction type are on the other hand p-doped, i.e. with impurities or defects of the acceptor type capable of supplying positive-charge electrical carriers.

It is of course possible, according to another embodiment, to choose the layers of material of the first conduction type to be p-doped and the layers of material of the second conduction type to be n-doped.

An object of the present invention is also a method of producing the above detector. This method includes the following successive operations:

a) producing, in a surface of a substrate, at least one depression with a depth D, b) forming on the surface and in the depression respectively a first layer of a material of a first conduction type, second and third layers of a material of a second conduction type, the second layer having a thickness less than the depth D, (c) making the layers planar along a plane parallel to the surface of the substrate and passing through each of the layers formed, preserving part of the first layer on the surface of the substrate, (d) producing a region of the first conduction type in a part of the third layer remaining after the making planar according to a method of the planar type, the region forming a fourth layer being separated from the second layer by the third layer, (e) producing chemical contacts on the first and third layers and on the region of the first conduction type.

The description which follows refers each time to a single detection element of the detector. A depression in the surface of the substrate corresponds to each of these elements. Naturally, the detector can include a large number of these detection elements also referred to as pixels. By way of example, the detector can be in the form of a matrix of 128×128 pixels with a pitch of 70 $\mu$m. One or more so-called "reading" circuits are associated with this matrix of detectors, and these circuits can for example be associated with the detector by means of a hybridisation method by means of connection pins.

The detector and therefore the detection elements are preferably illuminated through a free surface of the substrate substantially perpendicular to the stack. This surface is referred to as the rear face in the remainder of the description.

To this end, the substrate is preferentially produced from a material transparent to the wavelengths of the infrared radiation which is to be detected, for example made from a cadmium, zinc, tellurium compound. It is also possible to produce the substrate from a material opaque to the wavelengths mentioned. In this case, the substrate is eliminated when the detector is activated so that the light directly reaches the first layer initially formed on the substrate.

In an alternative embodiment of the detector in which the order of the different parts is reversed, it is possible to provide illumination through the plane surface where the layers of the stack show.

The part of the first layer preserved on the surface of the substrate serves to electrically connect together the detection elements of the detector. Thus an electrode common to all the detection diodes can be formed on the layer 116, which is a layer common to all the detection elements.

When this common layer is made from an n-doped semiconductor, i.e. where the majority carriers are electrons, the series resistance of one detector decreases. This improves the characteristics of the detection in the first photodiode.

BRIEF DESCRIPTION OF THE FIGURES

Other characteristics and advantages of the invention will emerge more clearly from the description which follows, given for purposes of illustration and non-limitatively, with reference to the accompanying drawings in which.

DETAILED DESCRIPTION OF EMBODIMENTS OF THE INVENTION

For reasons of clarity the figures and the parts which make them up are not shown to scale.

Figure 1:
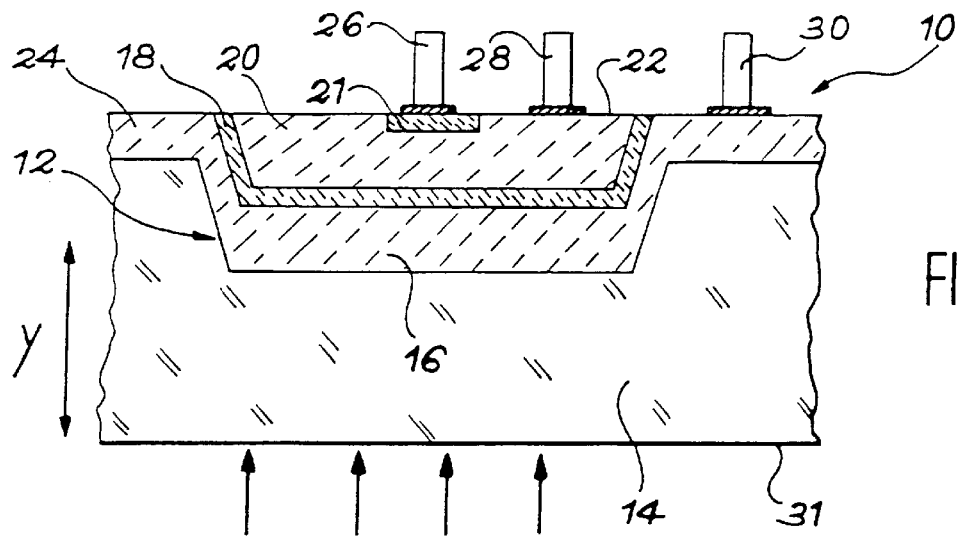
FIG. 1 is a schematic sectional view of a detection element of a detector according to the invention.

As shown in FIG. 1, a detection element 10 of the detector is produced in a depression 12 in the substrate 14. The detection element 10 has a layer 16 of a material of a first conduction type, for example an n-type material, a layer 20 of a material of a second conduction type, for example p-type, separated from the layer 16 by a layer 18 forming a case and which is also a material of the second conduction type. It is not necessarily a closed case, but the case must separate the layer 20 from the layer 16. The detection element has another layer 21 of the first conduction type which is formed in the layer 20 and which the layer 20 separates from the layer 18.

As can be seen in FIG. 1, each layer of semiconductor material has a region showing on the surface of a plane surface 22 of the detection element. Each detection element is therefore composed of a stack of layers or semiconductor parts which show on the surface 22 substantially perpendicular to the direction of the stack. Stacking the different parts ensures the spatial coherence of the detection. The layer 16 and the layer 18 form a first diode for detecting infrared radiation with short wavelengths, for example in the range from 3 to 5 $\mu$m. The layer 20 and the layer 21 form a second diode for detecting longer wavelengths in the range for example from 8 to 12 $\mu$m.

The detector or detection element is illuminated through a face 31, referred to as the rear face, and preferably in a direction substantially parallel to the direction of the stack, that is to say perpendicular to the face 31.

By virtue of the stacking of the different parts of the detection element, the diodes are not juxtaposed but superimposed, which ensures the spatial coherence of the detection. In addition, the two diodes are connected in series and with opposite electrical biasing.

The materials used for producing the various parts of the detector and the thickness of the layers as well as heir doping are summarised by way of example in Table I.

TABLE I

| PART | MATERIAL | THICKNESS | DOPING TYPE | DOPING DENSITY |
|---|---|---|---|---|
| SUBSTRATE | $Cd_{0.96}Zn_{0.04}Te$ | | | |
| LAYER 16 | $Cd_{0.30}Hg_{0.70}Te$ | 5 $\mu$m | n | $10^{17}/cm^3$ |
| LAYER 18 | $Cd_{0.30}Hg_{0.70}Te$ | 2 $\mu$m | p | $10^{16}/cm^3$ |
| LAYER 20 | $Cd_{0.22}Hg_{0.78}Te$ | 7 $\mu$m | p | $10^{16}/cm^3$ |
| LAYER 21 | $Cd_{0.22}Hg_{0.78}Te$ | 2 $\mu$m | n (implantation) | |

The compositions and parameters given in Table I should be understood as orders of magnitude and are given only for indication. The active layers of the detection element can, in more general terms, be chosen from amongst compounds III–V, II–V, IV–IV or IV–VI (the Roman numerals indicate elements in the corresponding columns of the periodic table of elements), the choice and combination of the materials mainly being dictated by the range of wavelengths to be detected.

Likewise, the substrate can be a semiconductor alloy of elements II–VI such as CdTe, ZnTe elements III–V, such as AsGa, or silicon-basea for elements IV–IV for example. It can also be made from sapphire or a combination of some of the materials mentioned. In addition, and in particular for the diode for detecting radiation with a short wavelength, it is possible to produce a heterojunction where the p-type part is of a different nature from the n-type part in order to improve the performance of the detection element.

As shown in FIG. 1, on the surface 22 of the detection elements substantially parallel to the rear face 31, Were are formed contact pins 26, 28, 30 respectively in electrical contact with the layer 21, the layer 20 and the layer 16. These contacts are designed to be connected to a circuit for using the detector measurements. Connection to a circuit for reading or using the measurements can for example be effected by means of metallic indium studs formed on the contacts.

For a more detailed description of this connection technique, reference can advantageously be made to FR 2,646,558. In this regard, FIG. 2 gives a better understanding of the electrical functioning of the detector as well as its connections with a reading circuit.

Figure 2:
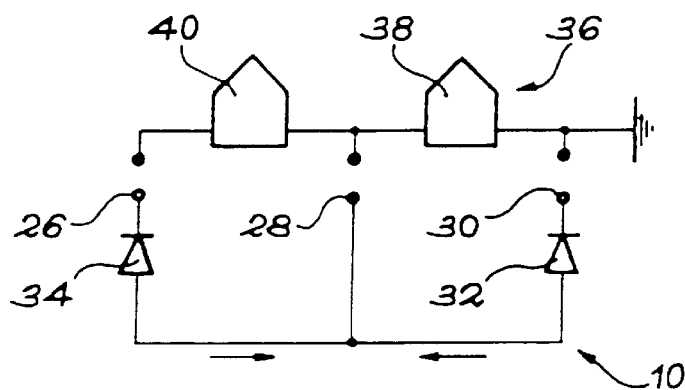
FIG. 2 is an equivalent electrical diagram of a detection element of a detector according to the invention.

In FIG. 2, the first and second diodes, i.e. on the one hand the diode 1 formed between the layer 16 and the layer 18 and on the other hand the diode formed by the layers 20 and 21, are depicted with the references 32 and 34. These two diodes, connected in opposite orientations, have in common, on the detection element, the contact 28 which is connected to the layer 20. The detection element 10 is connected to an output circuit 36 which has a first output 38 and a second output 40. The first output 38 is associated with the diode 32 or detecting infrared radiation with a shorter wavelength and the second output 40 associated with the diode 34 corresponds to the detection of infrared radiation with a longer wavelength.

Figure 3:
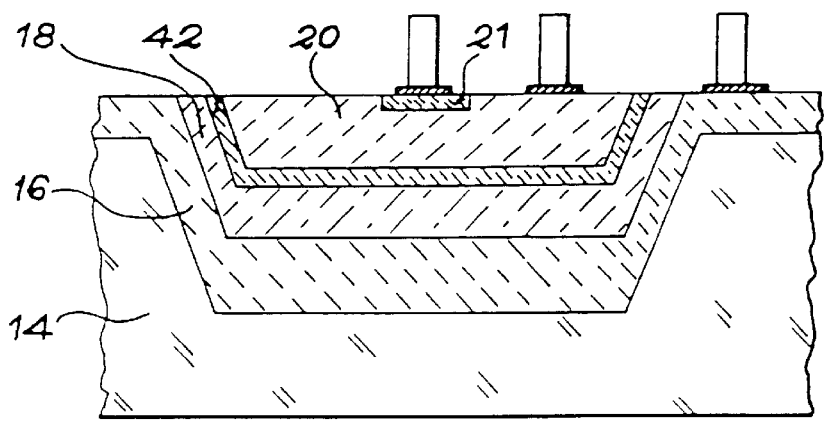
FIG. 3 is a sectional view of an alternative detection element of a detector according to the invention.

In FIG. 3, which is an alternative embodiment of the detector, identical elements bear the same references as in FIG. 1. In FIG. 3, an additional layer 42 can be noted, interposed between the layer 18 and the layer 20. The layer 42 duplicates the case of the layer 18. It is produced from a p-doped material which has in its composition a higher proportion of cadmium than the case or the layer 20. The function of the additional layer is to form a barrier to any photoelectrons of the first photodiode which might be generated in the layer 18 and which might be read in the second photodiode.

Figure 4A:
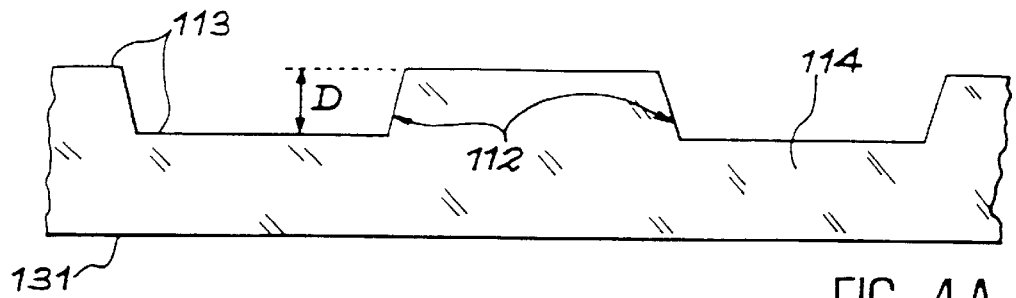
FIGS. 4A to 4D are sectional views illustrating the method of manufacturing a detection element of a detector according to the invention.

FIG. 4A illustrates the first step of a method of manufacturing the detector of the invention. In this figure and in the following figures, elements corresponding to elements in FIGS. 1 to 3 bear references which also correspond, to which 100 has been added. In a surface 113 of a substrate 114, one or more depressions 112 are etched, which define the location of the detection elements. The depth of the depressions depends on the thickness of the layers which will be deposited subsequently. By way of example, this depth may be 11 $\mu$m, which corresponds to the thicknesses of the layers mentioned in Table I. The depressions can be produced by etching, chemically or by dry method. When the detector is in the form of an array of several detection elements or a matrix of detection elements or pixels, the depressions are etched according to the pitch of this matrix in a repeated periodic pattern. By way of example, the depressions can be etched with a spatial periodicity of 70 $\mu$m. When the substrate is etched in this way, the active layers are formed thereon, i.e. layers of semiconductor material which will form the various parts of the detection element.

Figure 4B:
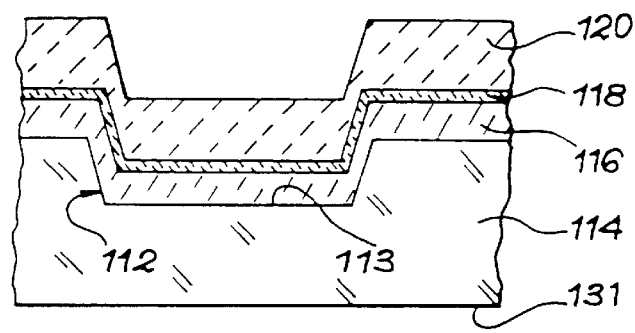

As shown in FIG. 4B, there are formed on the surface 113 successively a layer 116 of material of the first conduction type, for example n-type, a second layer 118 of the material of a second conduction type, i.e. p-type, then a third layer 120 of a material still of the second conduction type. The layers are formed by epitaxy, for example using an epitaxy process by molecular beam known as MBE ("Molecular Beam Epitaxy"). Other growth techniques such as vapor phase epitaxy (VPE) or deposition assisted by organometallic precursors, MOCVD ("Metal Organic Chemical Vapor Deposition"), can also be envisaged. With regard to the technological operations of forming the layers, reference can advantageously be made to Faurie and Million, "Molecular Beam Epitaxy of II–VI Compounds: $Cd_xHg_{1-x}Te$", Journal of Crystal Growth 54, pp. 582–585 (1981); and Million et al., "HgCdTe Double Heterostructure for Infrared Injection Laser", Journal of Crystal Growth 127, pp. 291–295 (1993).

The materials used for the layers 116, 118 or 120 are materials designated for the corresponding layers 16, 18 and 20 in FIG. 1.

After the formation of the layers 116, 118 and 120, the whole is processed on the side of the layer 120, for example by chemical plasma etching, by mechanical abrasion, by ion machining or a combination of these processing techniques. This etching defines on the structure a plane surface 122 visible in FIG. 4C. It is substantially perpendicular to the stack of layers.

Figure 4C:
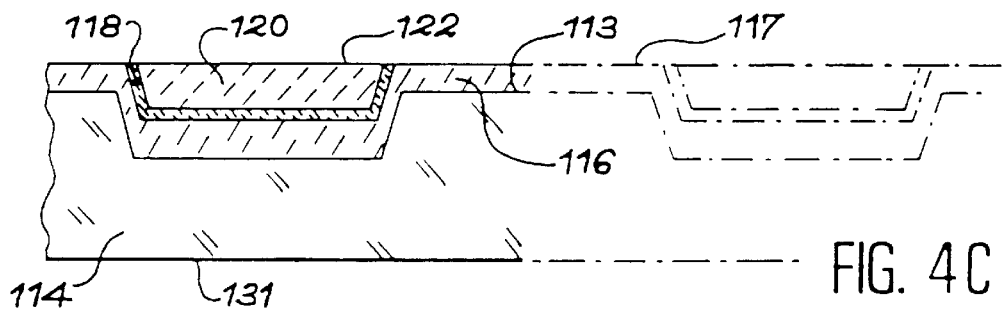

The structure has, as can be seen in FIG. 4C, at present a layer 116 made from an n-doped material, a case formed by the layer 118 and a p-doped region which results from the layer 120. When the detector has several detection elements, at the time of etching, a part 117 of the layer 116 is preserved on the surface 113 of the substrate 114 in order to provide electrical continuity between the detection elements. To this end, the planar etching is stopped after having eliminated a thickness of 1 to 2 $\mu$m of the layer 116. The layer 116 is thus a common layer for all the detection elements.

Figure 4D:
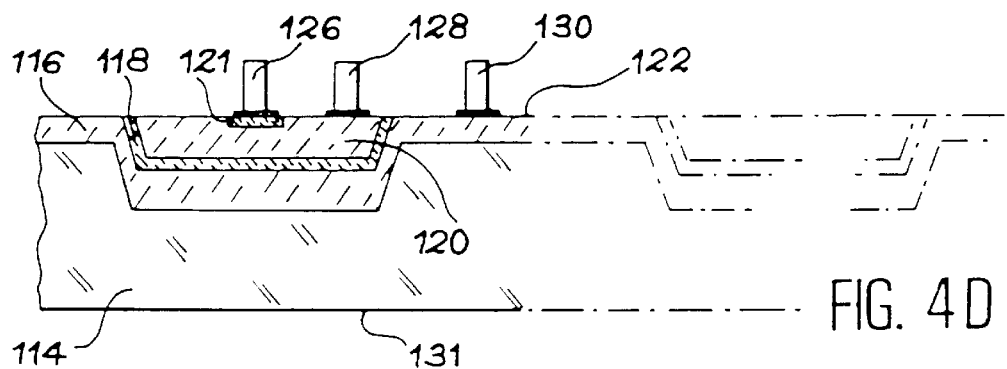

After obtaining the plane surface 122, an n-doped region which bears the reference 121 is formed in the layer 120. This region constitutes the fourth layer already defined above. This layer 121, depicted in FIG. 4D, forms, with the layer 120, the diode detecting long wavelengths. It can be produced either by diffusion or by implantation. In this regard reference can be made to Willardian and Beer, "Semiconductor and Semimetals", Vol. 18, pp. 273–283 (Academic Press, 1981); and Amingual, "Advanced Infrared Focal Plane Array", SPIE, Vol. 1512, Infrared and Optoelectronic Materials and Devices (1991). By virtue of this aspect, the n-p junction of the photodiode sensitive to long wavelengths of infrared radiation, effected in a material with a small forbidden band, opens out on a plane surface which is therefore easy to isolate electrically or to passivate. It is thus possible to reduce the problems of electrical leakage at this junction.

The manufacture of the detector continues with the formation of contact pins 126, 128, 130. These contacts correspond to the contacts 26, 28 and 30 of the previous figures.

Illumination of the structure can take place through the face of the substrate referenced 131 in FIGS. 4A to 4D. However, according to one particular implementation of the invention, the manufacturing method can be continued with the elimination of the substrate in order to bare the layer 116, which therefore directly receives the infrared radiation. The substrate can be eliminated for example by polishing or chemical etching.

What is claimed is:

1. A dual-band planar infrared detector with space-time coherence, comprising:
   at least one detection element comprising a plurality of semiconductor layers stacked along a direction and configured to form first and second photodiodes electrically connected in series and oppositely poled;
   wherein each layer of said plurality of stacked semiconductor layers has a part configured to reach a surface of the detection element, the surface being substantially perpendicular to said direction.

2. An infrared detector according to claim 1, wherein the plurality of semiconductor layers comprises:
   a first layer made from a material of a first conduction type,
   at least one second layer made from a material of a second conduction type,
   a third layer made from a material of the second conduction type, separated from the first layer by the second layer, and
   a fourth layer made from a material of the first conduction type, separated from the second layer by the third layer, the first and third layers forming respectively, with the second and fourth layers, the first and second photodiodes.

3. An infrared detector according to claim 1, wherein the layers are produced from alloys of cadmium, mercury and tellurium.

4. An infrared detector according to claim 2, wherein the first conduction type is a conduction by positive charge electrical carriers and the second conduction type is a conduction by negative charge electrical carriers.

5. A dual-band infrared detector according to claim 2, further comprising a substrate configured to support the first layer, said substrate being transparent to infrared radiation.

6. An infrared detector according to claim 1, wherein the first photodiode and the second photodiode are respectively sensitive in first and second infrared radiation spectra, the first spectrum corresponding to wavelengths shorter than those of the second spectrum.

7. An infrared detector according to claim 1, further comprising a plurality of detection elements electrically connected together by a common layer of material forming respectively the first layer of each element.

8. An infrared detector according to claim 7, wherein said plurality of detection elements is disposed in rows and/or columns of a matrix of pixels.

9. An infrared detector according to claim 2, further comprising a common contact electrode connected to said first layer and, for each detection element, a contact electrode respectively for the first diode and connected to the third layer and a contact electrode respectively for the second diode and connected to the fourth layer.

10. A method of manufacturing a dual-band infrared detector with space-time coherence according to claim 1, comprising the steps of:
   a) producing, in a surface of a substrate, at least one depression having a depth,
   b) forming on the surface and in the depression respectively a first layer of a material of a first conduction type, second and third layers of a material of a second conduction type, the second layer having a thickness less than the depth,
   c) making the layers planar along a plane parallel to the surface of the substrate and passing through each of the layers formed, preserving part of the first layer on the surface of the substrate,
   d) producing a region of the first conduction type in a part of the third layer remaining after the making planar according to a method of the planar type, the region forming a fourth layer being separated from the second layer by the third layer, and
   e) producing ohmic contacts on the first and third layers and on the region of the first conduction type.

11. A manufacturing method according to claim 10, further comprising eliminating the substrate after step (c).

12. A method according to claim 10, wherein steps b) and d) are performed so that the first conduction type is a conduction by a positive-charge electrical carriers and the second conduction type is a conduction by negative-charge electrical carriers.

13. A method according to claim 10, wherein during step d), the region of the first conduction type is formed by diffusion or implantation.

* * * * *